United States Patent
Ganesan (10) Patent No.: US 8,928,184 B2
(45) Date of Patent: Jan. 6, 2015

(54) RELIABLE LOW-COST HYBRID SWITCH MODULE FOR SWITCHED POWER DISTRIBUTION SYSTEMS

(75) Inventor: Sankaran Ganesan, San Jose, CA (US)

(73) Assignee: Echola Systems, LLC., San Jose, CA (US)

( * ) Notice: Subject to any disclaimer, the term of this patent is extended or adjusted under 35 U.S.C. 154(b) by 902 days.

(21) Appl. No.: 13/111,750

(22) Filed: May 19, 2011

(65) Prior Publication Data

US 2012/0092060 A1     Apr. 19, 2012

Related U.S. Application Data

(60) Provisional application No. 61/455,192, filed on Oct. 15, 2010.

(51) Int. Cl.
| | |
|---|---|
| B23K 11/24 | (2006.01) |
| H02B 1/24 | (2006.01) |
| H03K 17/722 | (2006.01) |
| H03K 17/082 | (2006.01) |

(52) U.S. Cl.
CPC .......... *H03K 17/722* (2013.01); *H03K 17/0824* (2013.01)
USPC ........................................................ 307/112

(58) Field of Classification Search
USPC ........................ 307/38, 39, 112, 132 E, 140
See application file for complete search history.

(56) References Cited

U.S. PATENT DOCUMENTS

| | | | |
|---|---|---|---|
| 4,466,038 A | 8/1984 | Robertson | |
| 4,500,934 A | 2/1985 | Kinsinger | |
| 4,642,481 A | 2/1987 | Bielinski et al. | |
| 5,473,202 A | 12/1995 | Mudge et al. | |
| 5,699,218 A | 12/1997 | Kadah | |
| 6,501,195 B1 * | 12/2002 | Barton | 307/125 |
| 7,079,363 B2 | 7/2006 | Chung | |
| 8,482,885 B2 | 7/2013 | Billingsley et al. | |
| 8,519,566 B2 | 8/2013 | Recker et al. | |
| 8,614,866 B2 | 12/2013 | Billingsley et al. | |
| 2011/0063759 A1 | 3/2011 | Billingsley et al. | |
| 2011/0102052 A1 | 5/2011 | Billingsley et al. | |

* cited by examiner

*Primary Examiner* — Carlos Amaya
(74) *Attorney, Agent, or Firm* — Vista IP Law Group, LLP (57) ABSTRACT

Disclosed are method and apparatus for implementing power distribution unit with a hybrid switching module. The apparatus comprises multiple outlets coupled to a hybrid switching module that switches on or off the plurality of outlets. The apparatus further comprises a single SSR for the hybrid switching module and two EMRs for an outlet and a controller that communicates with the hybrid switching module via digital line(s) to control power distribution. The apparatus comprises a display for displaying information related to the power outlets, two current detection circuitries for monitoring the total input current and an individual outlet, and a voltage detection circuitry for sensing voltages. The number of outlets may be scaled by using one or more hybrid switching module that share the single SSR. The apparatus further comprises a web server running thereon to interface with remote users to process the user's requests for the apparatus.

20 Claims, 12 Drawing Sheets

RELIABLE LOW-COST HYBRID SWITCH MODULE FOR SWITCHED POWER DISTRIBUTION SYSTEMS

CROSS REFERENCE TO RELATED APPLICATION(S)

The instant Application claims the benefit of U.S. Prov. App. Ser. No. 61/455,192 entitled "RELIABLE LOW-COST HYBRID SWITCH MODULE FOR SMART SWITCHED LOWER DISTRIBUTION SYSTEMS" and filed on Oct. 15, 2010. The contents of the aforementioned application is hereby expressly incorporated by reference in its entirety.

BACKGROUND OF THE INVENTION

1. Field of the Invention

Various embodiments relate generally to power distribution system and more specifically to a reliable low-cost hybrid switch module for providing a low cost and highly reliable smart switched power distribution system and method to use the same.

2. Description of the Related Art

It may be appreciated that power distribution system have been in use for years. Typically, switched power distribution systems sometime referred to as switched PDUs (power distribution unit) use either expensive solid state relays (SSRs) or cheaper electro-mechanical relays (EMRs) to switch power On/Off of individual outlets which distributes AC (alternating current) power to devices such as servers and switches found in typical datacenter racks. While these devices may be suitable for the particular purpose to which they address, they are not as suitable for providing highly reliable smart switched power distribution system and method to use the same for datacenter applications such as individual outlet level power distribution control, power monitoring, and management at affordable price.

The main problem with conventional EMR based power distribution system is its poor reliability due to contact bounce, especially with high current loads. The mechanical contact could produce arc when the electromagnetic relay controls a high voltage and large current flows that could lead to reduced contact lifetime—even contacts gel welded sometime. Usually the electrical lifetime may be about fifty to one hundred thousand times, but the mechanical lifetime may be over one million times. Mechanical relays also produce electro-magnetic interferences and high power dissipation when switching large AC currents.

On the other hand, one of the main problem with SSR based PDUs is the cost. Another issue with SSR is that it waste power in the form of heat due to nominal voltage drop across semiconductor switching path. For example, SSR may consume more than 30 watts of power for a 20 A load per PDU. Typical midsize datacenter may have few hundreds of these PDUs so the thermal management not only bumps up the cost of PDU in terms of installing heat sinks but also increases the total cost of ownership for the end user in terms of power (HVAC or Heating, Ventilation, and Air Condition) wasted in cooling the heat produced by these PDUs. But to have a reliable PDU, so called hybrid relays may be used for each of the outlets but the cost of having such relays in a PDU doesn't justify the advantage of using them. It will become more expensive because a PDU may have multiple outlets ranging from four to 32 outlets sometimes even 64, as each outlet would require separate hybrid relay. The hybrid relays combine the benefits of an electro mechanical relay (EMR) and a solid-state relay (SSR) while reducing or eliminating the disadvantages of each. The cost of hybrid relay is high mainly because of the expensive SSR used in the package. An SSR is approximately 10 times more expensive than an EMR. A hybrid relay is two times more expensive than a SSR. That could be one of the reasons that the prior art of switched PDUs use either solid stale relays (SSR) or electro mechanical relays (EMR) to switch power On/Off for individual outlets of the PDU. The hybrid relay itself is not a new concept, the prior art hybrid relay has one EMR, a SSR and a controller integrated in one package.

These types of stand-alone hybrid relays prevent arcing of electro mechanical relays inside them and improves its lifetime. But these cannot scale for multiple outlets of a switched PDU without increasing the cost of switched PDU multiple limes.

Another problem with conventional power distribution system which provides power or current monitoring are that they use individual sensor and corresponding interface circuits for each outlet to do individual outlet power or current monitoring. This would bump up the cost of PDU because as discussed above there could be outlets up to 64 outlets per PDU which means 64 sensors and corresponding analog frontends.

Another problem with conventional power distribution system are that there is no individual outlet level overload protection with fast automatic recovery. There are only circuit breakers for overload protection at circuit level only which would require manual recovery.

In these respects, the reliable low-cost smart switched power distribution system using the hybrid switch module according to the various embodiments described herein substantially departs from the conventional concepts and designs of the prior art, by using only one SSR that is shared with all EMRs to provide switching reliability as good as a hybrid relay and cost as low as conventional PDUs, and in so doing provides an apparatus primarily developed for the purpose of providing a low cost and highly reliable smart switched power distribution system and method to use the same.

SUMMARY OF THE INVENTION

In view of the foregoing disadvantages inherent in the known types of power distribution system now present in the prior art, various embodiments provide a new reliable low-cost switch module for switched power distribution system construction wherein the same may be utilized for providing a low cost and highly reliable smart switched power distribution system and method to use the same.

The general purpose of various embodiments, which will be described subsequently in greater detail, is to provide a new reliable low-cost switch module that bring many of the advantages for a switched power distribution system mentioned heretofore and many novel features that result in a new reliable low-cost smart switched power distribution system which is not anticipated, rendered obvious, suggested, or even implied by any of the prior art power distribution system, either alone or in any combination thereof.

To attain this, some embodiments comprise a hybrid switching module (hybrid switching module may refer to combination of EMR switching module and a SSR unless it is mentioned as separate EMR switching module) with a pair of EMRs for each outlet (for instance 8 out let system will have 16 EMRs) and a SSR with zero-crossing detection capability for each EMR switching module, a current sensor for measuring RMS current, a voltage detector for measuring RMS voltage, a microcontroller module/embedded processor (hereinafter controller) with a DSP (Digital Signal Processor)

and current and voltage sensing frontends, a LCD (Liquid Crystal Display) panel for displaying vital information and a dual output power supply module with +12V for EMR switching module and +5V for logic part of all modules. EMR switching module has a pair of EMRs for each outlet. One EMR switching module may have eight such pairs and corresponding relay drivers.

An EMR switching module may also include a latch for each relay and a latch enable input for all of these latches connected to the embedded processor/controller control lines. Many such switching modules may be used to scale up number of outlets. SSR used in this invention is a high current, optically isolated, zero crossing semiconductor relay with low DC (Direct Current) trigger voltage (e.g., as low as 3V). The PDU also has two RMS (root mean square) current sensors one for the total current (inlet sensor) and another for individual outlet load current (outlet sensor) in some embodiments. The current sensor may be inductive (Current Transformer or Rogowski coil) or resistive (shunt) based at least in part on the power consumption measuring accuracy, maximum load current, and/or cost based on the application. Voltage detector may comprise a simple AC voltage divider with resistance sufficient enough to drive controller module's analog input. The controller module consists of an 8-bit microcontroller. The controller may additionally comprise a DC converter for converting, for example, 5V to 3.3V, an Ethernet driver, an EEPROM (Electronically Erasable Programmable Read-Only Memory), an RTC (real-time clock), a DSP (Digital Signal Processor), current and voltage sensing circuits in some embodiments. LCD panel may comprise a 2 row 16 character display mounted on the front panel of the power distribution system to show vital information. The power supply module provides two separate outputs, one with +5 v for all logics and +12 v for relay drivers.

There has thus been outlined, rather broadly, the more important features of various embodiments of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that various embodiments the invention are not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting unless the claims explicitly recite or include as such.

A primary object of various embodiments is to provide a hybrid switch module for a smart switched power distribution system that will overcome the shortcomings of the prior art devices.

An object of various embodiments is to provide a highly reliable and low cost smart switched power distribution system using so called hybrid relay based switch module and the method for using the same.

Another object is to provide a reliable low-cost smart switched power distribution system using the same hybrid switch module that supports datacenter features such as outlet level power monitoring and outlet level overload protection using the same shared solid slate relay with a shared RMS current sensor.

Another object is to provide a reliable low-cost smart switched power distribution system using the same hybrid switch module that consumes very little power compared to prior art devices.

Another object is to provide a reliable low-cost smart switched power distribution system using the same hybrid switch module which allow configuration of two or more relays in parallel for high current versions of the system and allow having more such switching modules in parallel to scale up number of outlets. The switched DC (direct current) power distribution systems may make use this high current capability.

Another object is to provide a reliable low-cost smart switched power distribution system using the same hybrid switch module that is capable of locally displaying the vital information such as each outlet's status including overload protection status, current/power consumption, IP address, hostname etc., using a LCD.

Other objects and advantages of various embodiments will become obvious to the reader and it is intended that these objects and advantages are within the scope of various embodiments of the invention. To the accomplishment of the above and related objects, various embodiments of this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features, and attendant advantages of various embodiments of the invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Turning now descriptively to the drawings, in which similar reference characters denote similar elements throughout the several views. The attached figures illustrate a reliable low-cost smart switched power distribution system, which comprises a hybrid switching module 34 with a pair of EMRs for each outlet and a SSR with zero-crossing detection capability for each EMR switching module, a current sensor for measuring RMS current, a voltage detector for measuring RMS, voltage, an embedded processor/microcontroller module with current and voltage sensing front-ends, a LCD panel for displaying vital information, and a dual output power supply module with +12V for EMR switching module and +5V for logic part of all modules in some embodiments.

Figure 3:
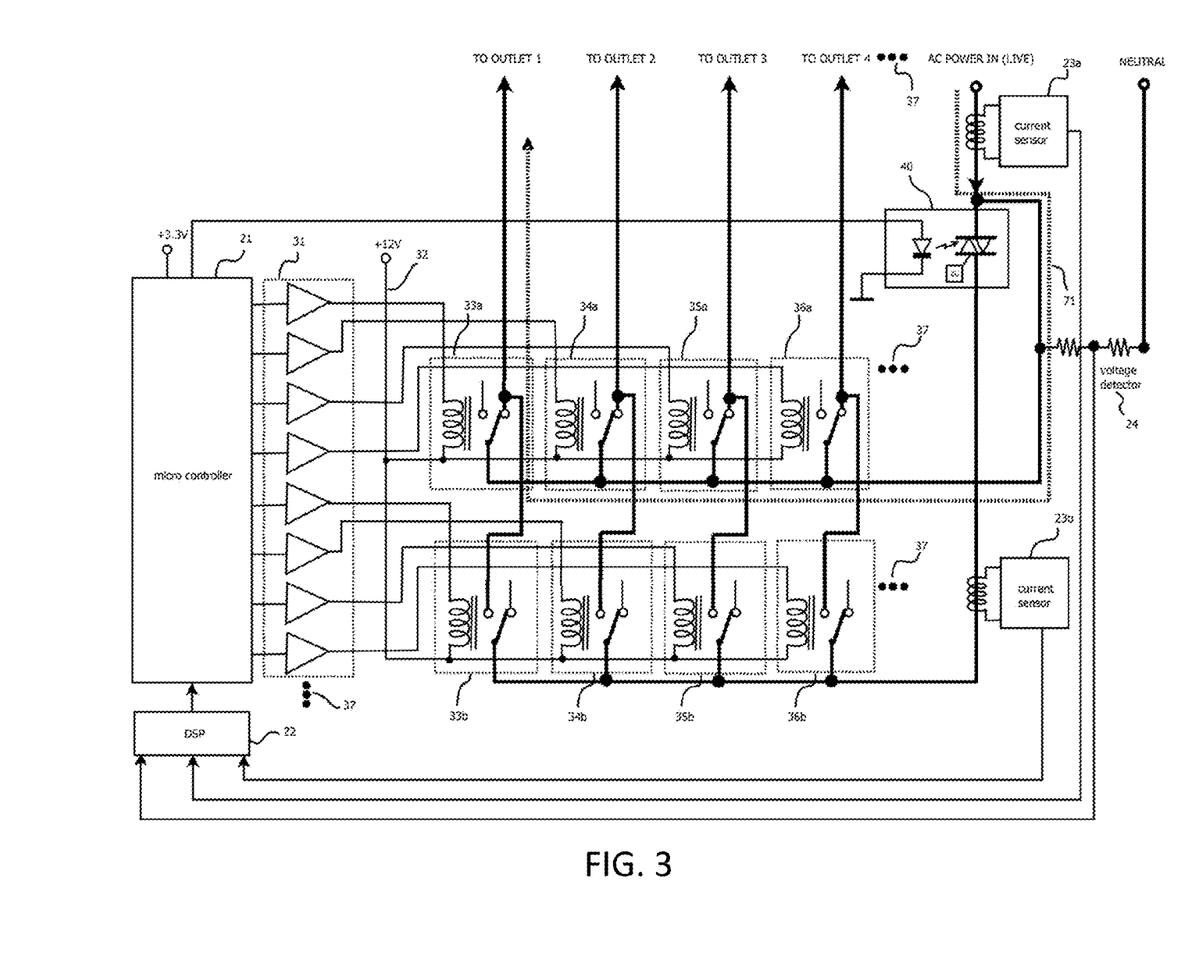
FIG. 3 illustrates a schematic diagram of switching module and related components.

The EMR Switching module 30 has pair of EMRs for each outlet connected in series as in FIG. 3. One module may have 8 such pairs and corresponding relay drivers. More than one such EMR switching module may be used to scale up number of outlets.

Solid state relay includes a stand-alone high current, optically isolated, zero crossing semiconductor relay with low DC trigger voltage (e.g., as low as 3V) in some embodiments. This PDU includes two RMS (root mean square) current sensors—one for the total current (inlet sensor), and another for individual outlet load current (outlet sensor). The current sensor may comprise inductive sensors (Current Transformer or Rogowski coil) or resistive sensors (shunt) based at least in part on the application. Voltage detector comprise an AC voltage divider with a resistance sufficient to drive controller module's analog input. This controller module includes a micro-controller or an embedded processor. It additionally includes a DC converter for converting, for example, 5V to 3.3V, an Ethernet driver, an EEPROM, an RTC (real-time clock), a DSP, and one or more current and voltage sensing circuitries. LCD panel comprises a two-row 16 character display mounted on the front panel of the power distribution system to show vital in formations.

The power supply module provides two separate outputs, one with +5 v for all logics, and the other with +12 v for relay drivers. The EMR Switching module 30 has pair of EMRs for each outlet. One module has eight such pairs of high current EMRs connected in series with the AC LIVE wire of each outlets as shown in FIG. 3. For example, EMR 33a is in series with EMR 33b, similarly EMR 34a is in series with 34b, and so on. To make switching module modular, the number of EMR pairs per module may be limited to eight in some embodiments. For example, if twenty four outlets are needed then three such modules may be used in these embodiments. Note that the EMR 33a is normally ON and EMR 33b is normally OFF to maximize the power saving when all outlets are ON in some embodiments.

The three dots 37 in the FIG. 3 shows that there are more relays connected in similar fashion. The switching module has two octal relay drivers 31 to drive all EMRs using +12 v DC. These EMRs with an SSR form a hybrid relay. EMR Switching module may optionally have two octal latches with an enable bit connected between the driver 30 and the micro controller module 20 to prevent any misfiring of EMRs during the reset of micro-controller. Another variation could be to have this switching module as an integrated package combined with an SSR and provide a serial interface for communication. For example, eight pairs of EMRs, latches, drivers, and an SSR along with a serial interface, all integrated into one package which may be used in stand-alone applications using external processor(s) or PC(s) (Personal Computer(s)) to control these individual components.

Solid state relay 40 comprises a stand-alone high current, optically isolated, zero crossing semiconductor relay with low DC trigger voltage as low as, for example, +3 v in some embodiments. It is capable of handling 120% of maximum rated current of the PDU system for safety and reliability reasons in some embodiments. The switching is optically isolated from the load. The SSR used here switches at zero voltage crossing of the power to reduce electro-magnetic interference (EMI) in some embodiments. Because an SSR is used temporarily in some embodiments, only while making switching transition to EMR, there is no need for heat sinks in the power distribution system in some embodiments. Solid state relay may also be integrated into the switching module, but it limits the sharing of the SSR to one module only in some embodiments. For example, twenty four outlets version of the system need three SSRs in these embodiments. The combination of EMRs and the SSR may be called a switching module 34 in some embodiments.

This PDU comprises two RMS (root mean square) current sensors—one for the total current (inlet sensor) and another for individual outlet load current (outlet sensor). The current sensor may be inductive (Current Transformer (CT) or Rogowski coil) or resistive (shunt), based at least in part on the application. The inlet current sensor 23a and outlet 23b shown in FIG. 3 comprise current transformers in some embodiments. The live wire may be run through the toroidal core of the inlet current transformer. Similarly, the live wire may be run through the core of outlet transformer to the SSR and finally to outlets for measuring individual outlet current. The current transformer's secondary, which produces voltage proportional to the current flowing on the live wire, is connected to the DSP's 22 analog frontend, which includes an ADC (analog to digital converter). If the PDU comprises two circuits (e.g., two inlets) then each of the two circuits may require a separate sensor and an SSR. Also, a shunt resistor may be a low cost alternative to a current transformer in some embodiments.

Figure 2:
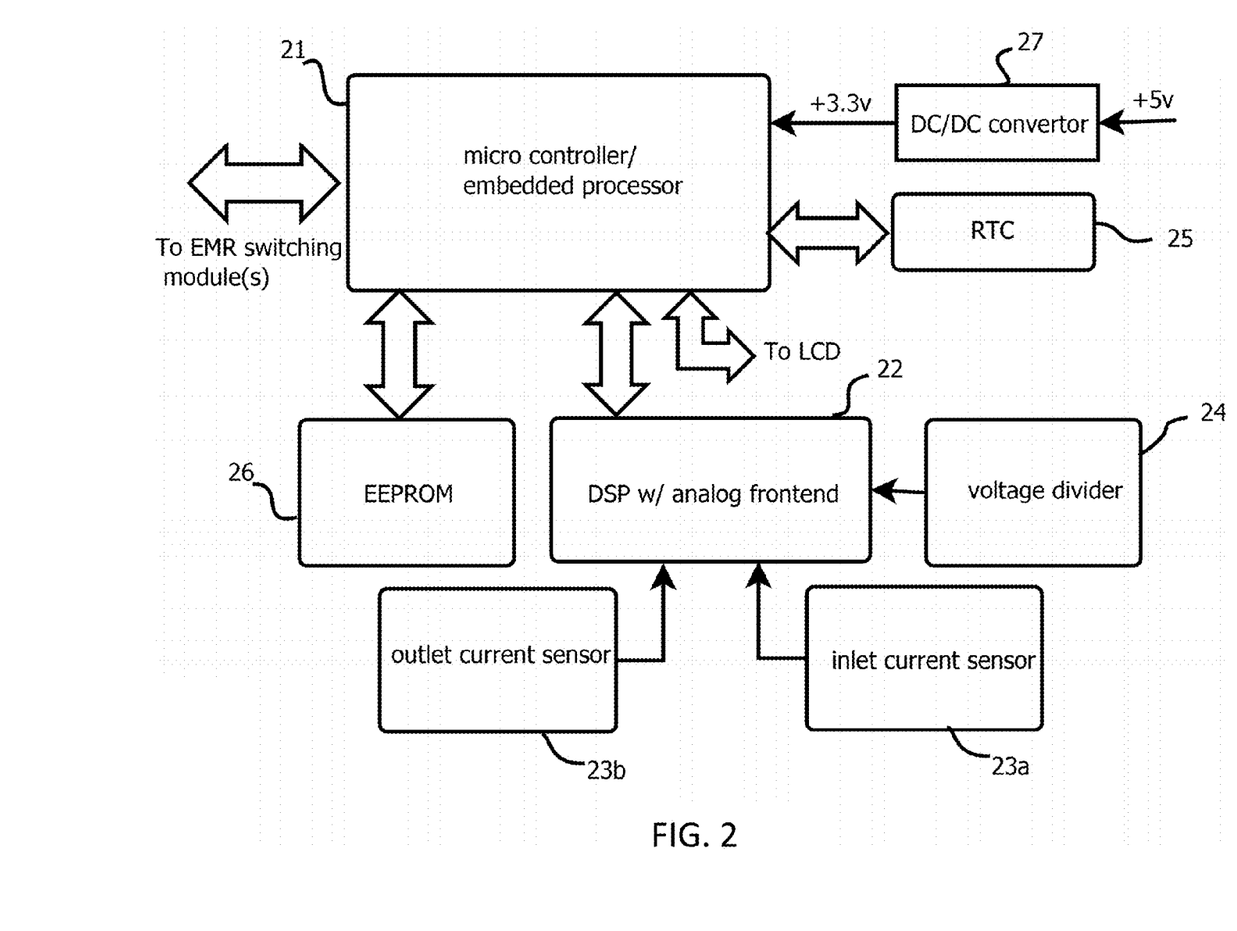
FIG. 2 illustrates a functional block diagram of the controller module.

Voltage detector comprises an AC voltage divider with sufficient resistance to drive controller module's analog input in some embodiments. The voltage detector comprises a resistive voltage divider used to measure RMS voltage in some embodiments. This measurement may be used in calculation of average power. This controller module includes a micro-controller or an embedded processor. It additionally includes a DC converter for converting, for example, +5V to +3.3V, an Ethernet driver, an EEPROM, an RTC (real-time clock), and/or a DSP with current and voltage sensing circuits. The microcontroller unit is an 8 bit controller—PIC (Programmable Integrated Circuit) 18 with a built-in Ethernet interface. The controller module 20 may use a DC/DC converter 27 to down convert, for example, +5V to +3.3V. The RTC 25 may be used for scheduling measurements and keep track of power consumption for days and months. The EEPROM 26 may be used to store configuration information and web pages which provide web interface for the power distribution system. The microcontroller runs a firmware which allows the micro-controller to control and monitor relays and sensors in some embodiments. The firmware supports TCP/IP, SNMP, DHCP, DNS, HTTP, SSL, SSH, SYSLOG and TELNET protocols over Ethernet interface to support remote management and control of the power distribution system in some embodiments. Embedded processor such as ARM is another option for controller module.

LCD panel 50 includes a two row sixteen character display mounted on the front panel of the power distribution system in some embodiments. LCD panel may be connected to the controller module and may be used for display vital information which are useful during deployment and maintenance. The LCD provides a scrolling display that doesn't require any human invention to read the display. The vital information such as each outlet's status including, for example, overload status, current/power consumption, IP address, and hostname, is displayed in a predetermined sequence for few seconds, and then it scrolls to display next piece of information, and so on. The contrast of LCD may be adjusted to a predefined value with a fixed resistor on controller module in some embodiments. Another variation of the LCD is to have buttons to scroll and read the information in some other embodiments.

Figure 1:
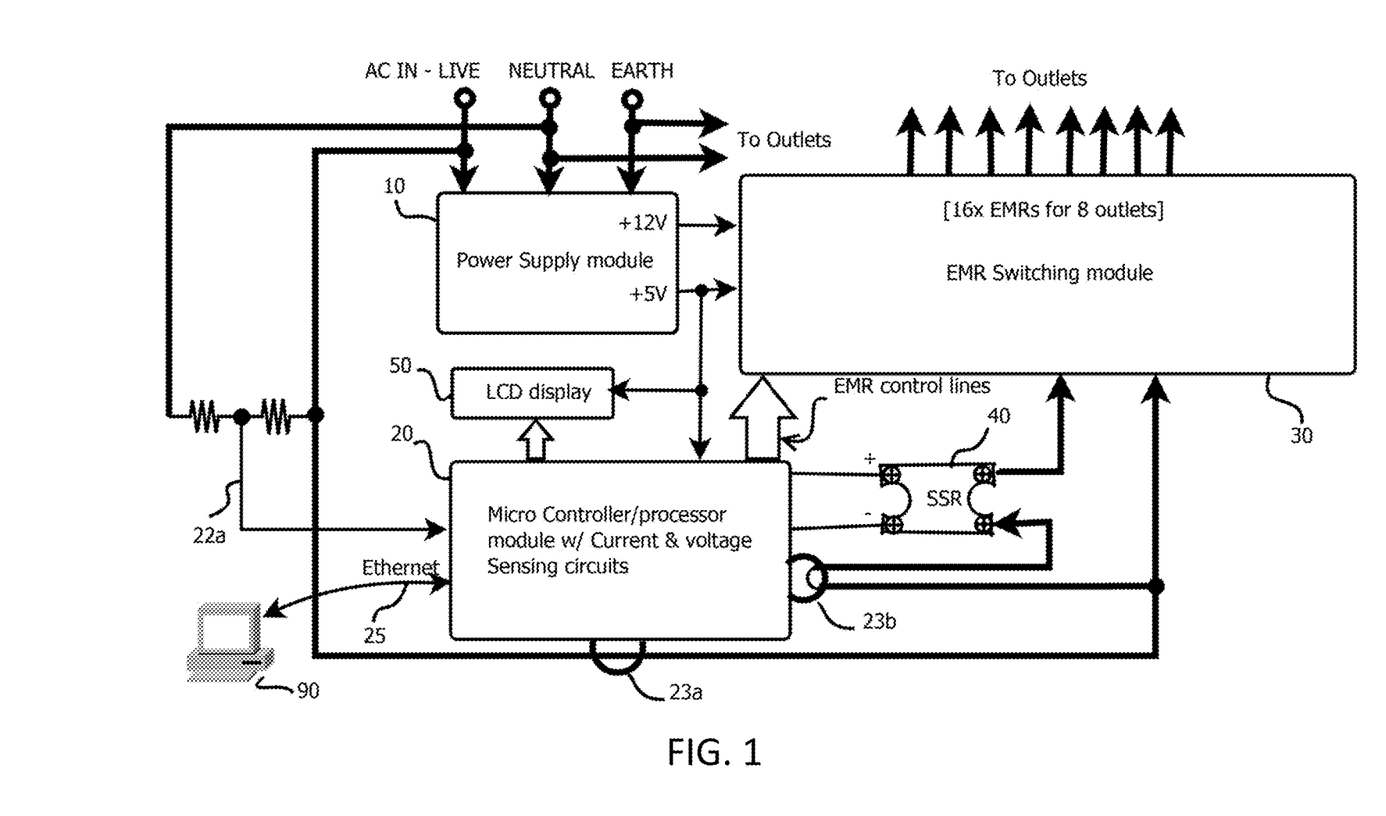
FIG. 1 illustrates a functional block diagram of the power distribution system.

The power supply module provides two separate outputs, for example, one with +5 v for all logics and the other with +12 v for relay drivers in some embodiments. This dual output SMPS (Switching Mode Power Supply) 10 provides overload protection and automatic recovery once overload condition is removed in some embodiments. The 3.3 v power may also provide directly by this power supply which would eliminate the need for a DC/DC converter in the controller module in some embodiments. The micro-controller 21 communicates with switching module 30, DSP 22, LCD 50, RTC 25, and SSR 40 through its digital I/O lines. When the user 90 initiates a request from remote to switch ON particular outlet through the web interface client 90, the request comes to HTTP server running on micro-controller in some embodiments. Then the server makes appropriate I/O routine(s) which enables particular digital IO line to switch ON the appropriate EMRs and SSR in particular sequence which is explained later in detail. The DSP's 22 analog frontend reads analog input from current and voltage sensors and converts that to digital.

The monitoring of current/power consumption through web interface is done in real time using Java® and XML over HTTP. When the web client 90 initiates a request for snap shot of current(s), the micro-controller reads the desired info from DSP and sends it to the web client 90. The micro-controller may also keep records of old snap shots by doing polling periodically that may be queried at any given time to generate reports like daily or monthly kilowatt-hour usage report. The micro-controller 21 also sends SNMP traps and/or syslog messages when there is critical conditions such as overload SSR need not be a stand-alone unit. It may comprise a discrete circuit part of the switching module in some embodiments as mentioned above or may comprise a discrete circuit as a part of the controller module in some other embodiments. This PDU shares both SSR and current sensors for individual outlet switching and monitoring respectively but there could be another variation where sharing of SSR may be needed but the sharing of sensor may not be preferred in some embodiments because of different accuracy requirements. In such cases, the individual shunt resistors may be used in series with the loads of each outlet in some embodiments. Another variation is to have this for DC power distribution systems and three-phase power distribution systems by changing current sensors accordingly. For DC distribution systems the shunt may be used and for three-phase current transformers are best.

Some embodiments of this invention include a pair of electromechanical relays for each outlet and one shared solid state relay for all outlets. For the purpose of explanation and illustration, these pairs of electro-mechanical relays are denoted as the primary relay and the secondary relay in some embodiments. For example, EMR 33a, 34a, 35a, etc. may be denoted as primary relays, and EMR 33b, 34b, 35b, etc. may be denoted as secondary relays. The primary relay is where load is mostly connected to but the secondary relay and SSR 40 are used only temporarily when switching outlet from ON to OFF and vice versa in some embodiments. The primary relays are normally closed in some embodiments, which means by default all the outlets are ON to save power consumed by each relay. The secondary relays are by default kept OFF in some embodiments. The micro-controller which controls these relays uses a suitable delay period (e.g., a few tens of milliseconds) between switching electro-mechanical relays (the primary relay or the secondary relay) and the solid state relay to allow for contact settling and thereby preventing arcing in various embodiments.

Figure 4A:
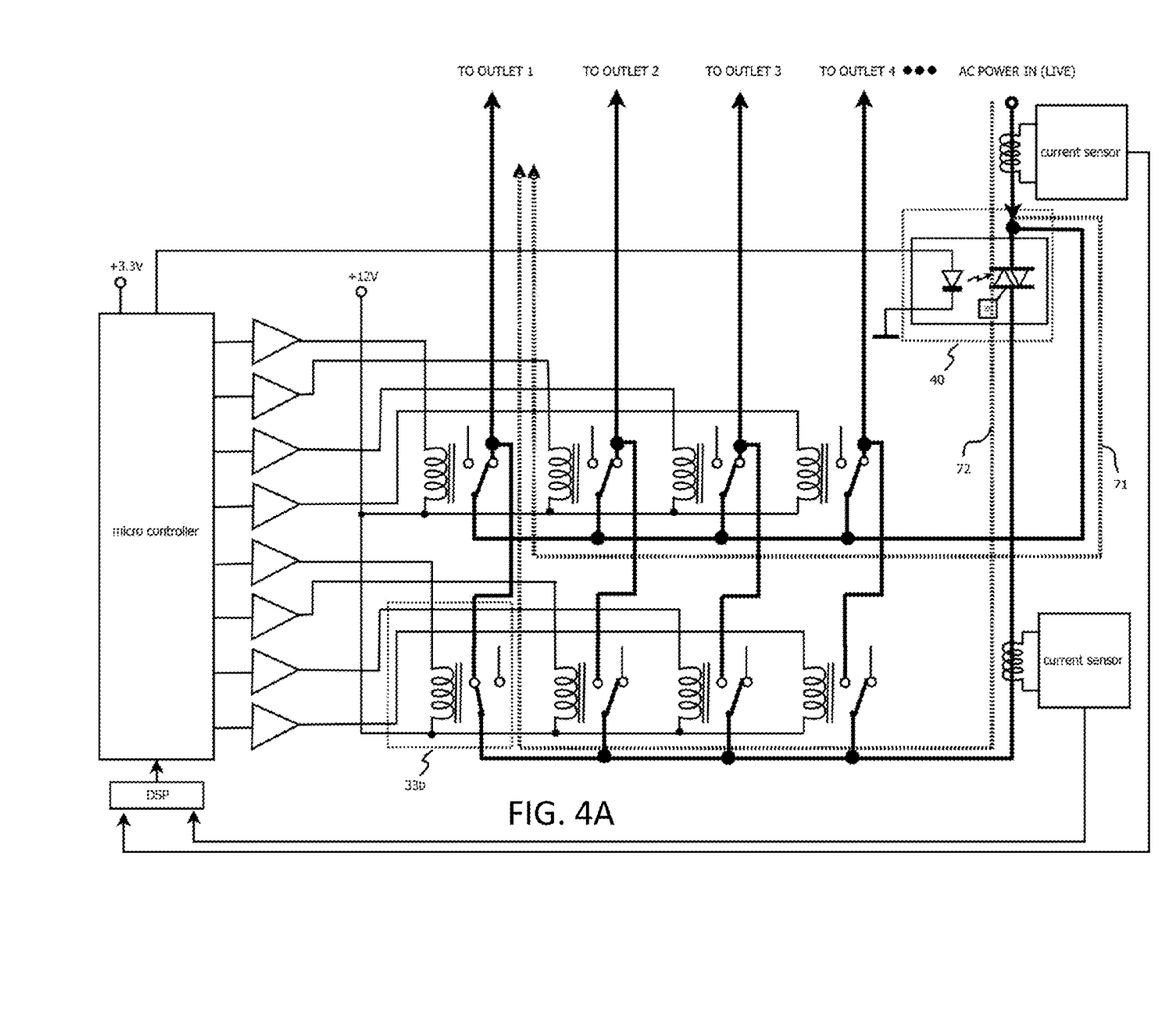
FIG. 4A illustrates a schematic diagram showing OFF sequence-1.
Figure 4B:
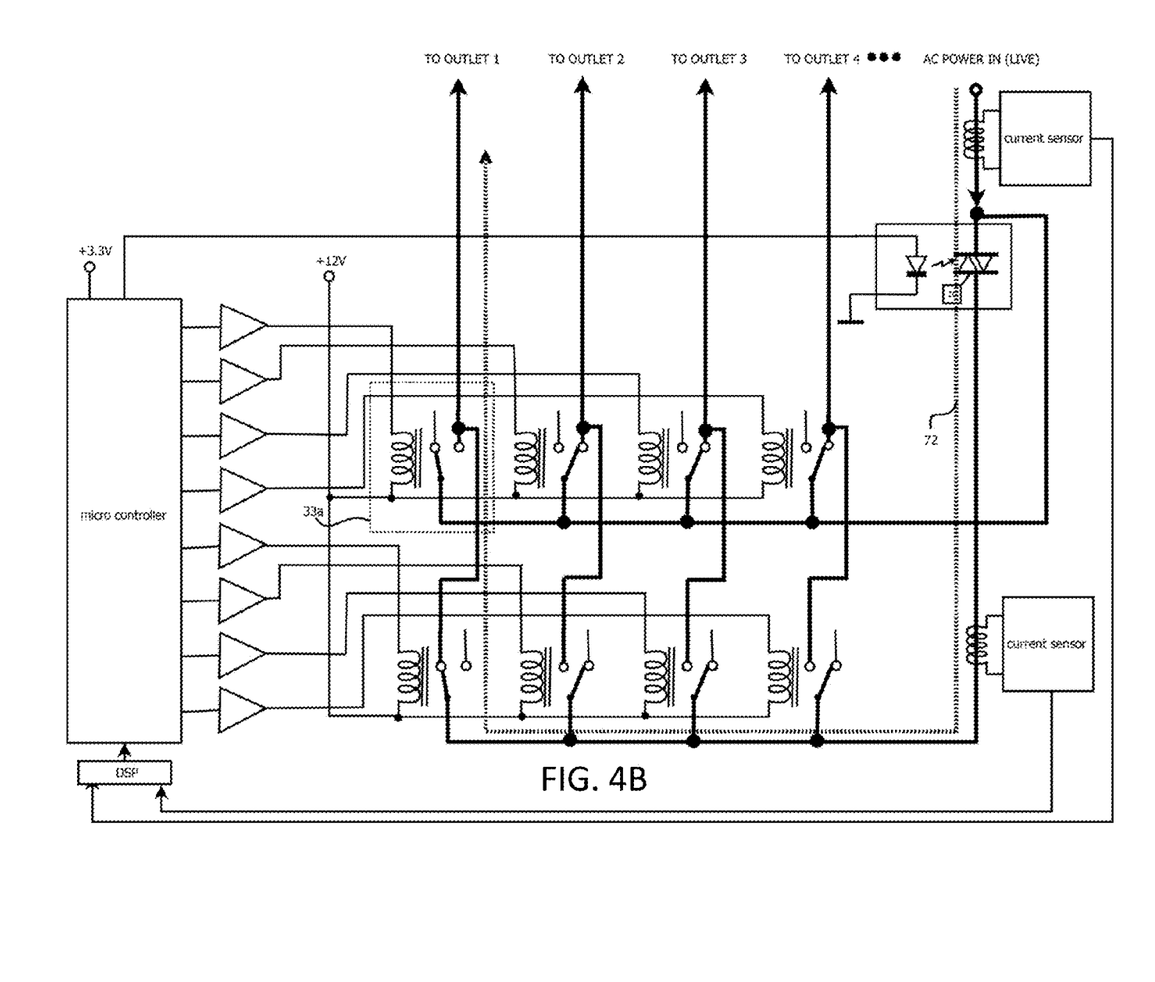
FIG. 4B illustrates a schematic diagram showing OFF sequence-2.
Figure 4C:
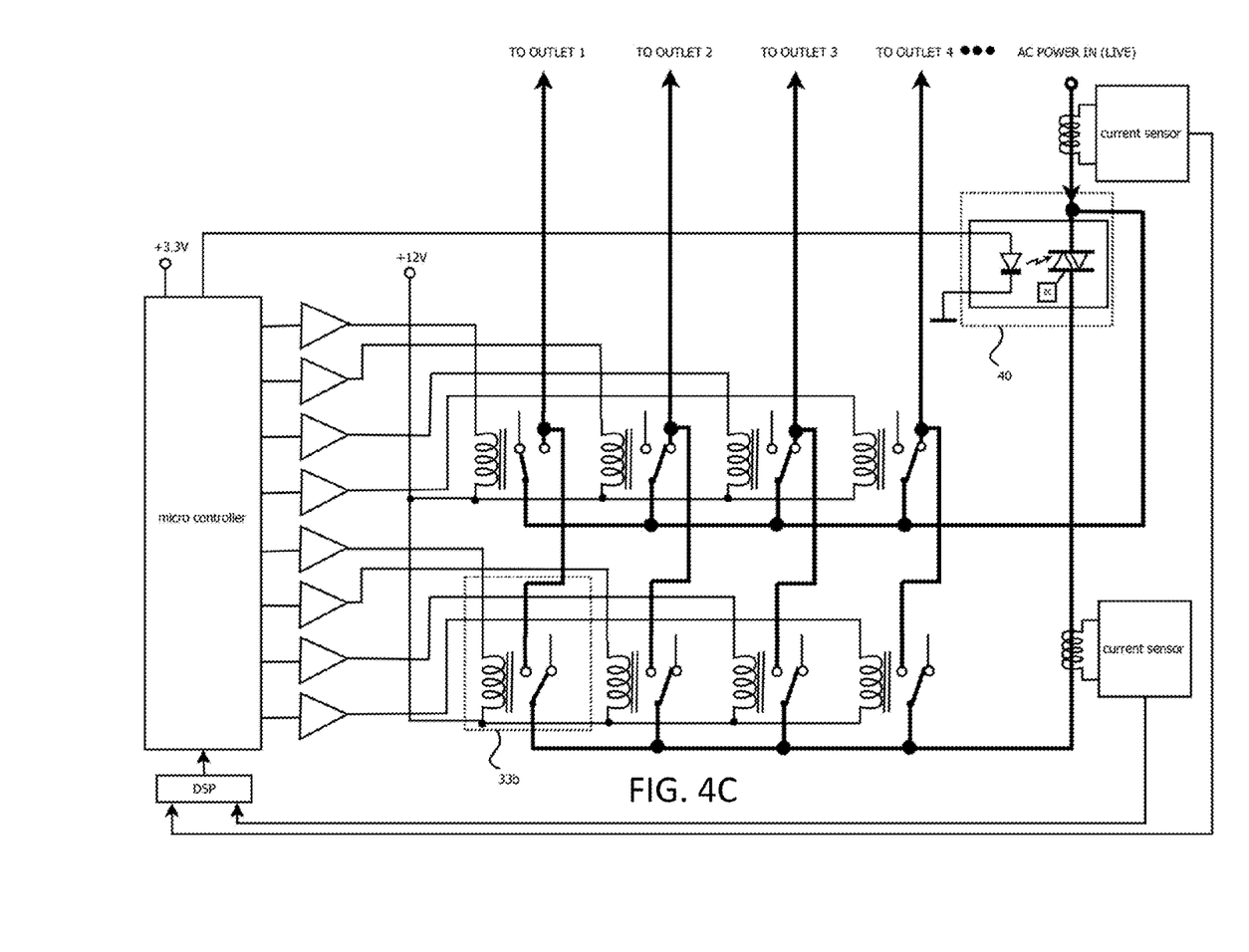
FIG. 4C illustrates a schematic diagram showing OFF sequence-3.
Figure 5A:
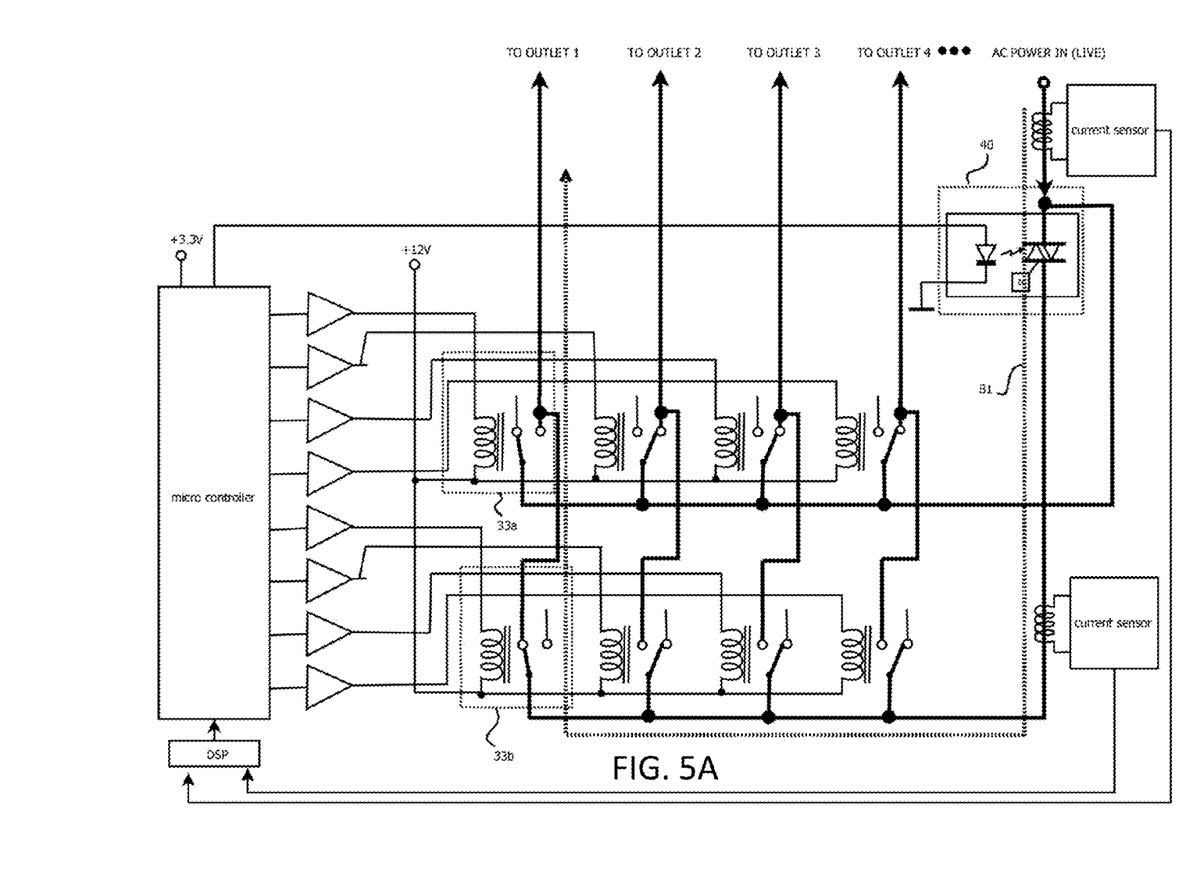
FIG. 5A illustrates a schematic diagram showing ON sequence-1.
Figure 5B:
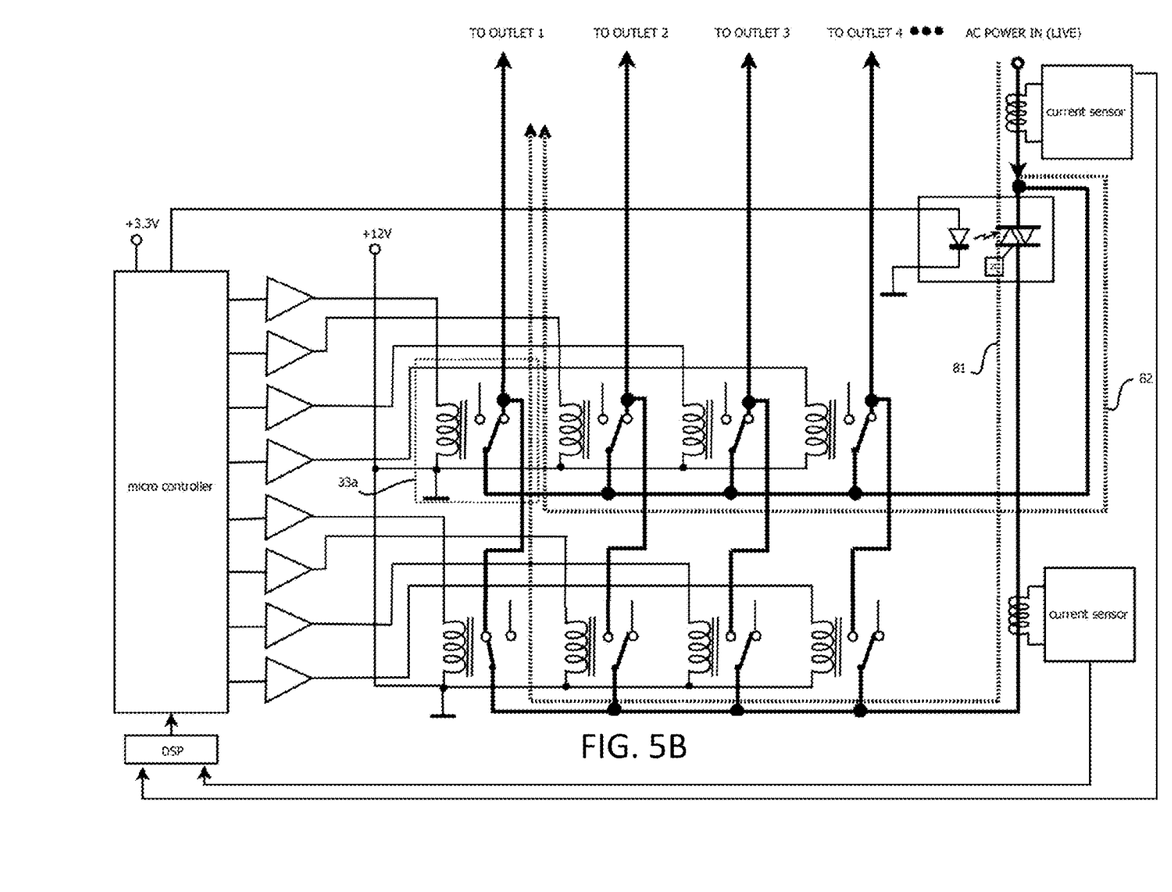
FIG. 5B illustrates a schematic diagram showing ON sequence-2.
Figure 5C:
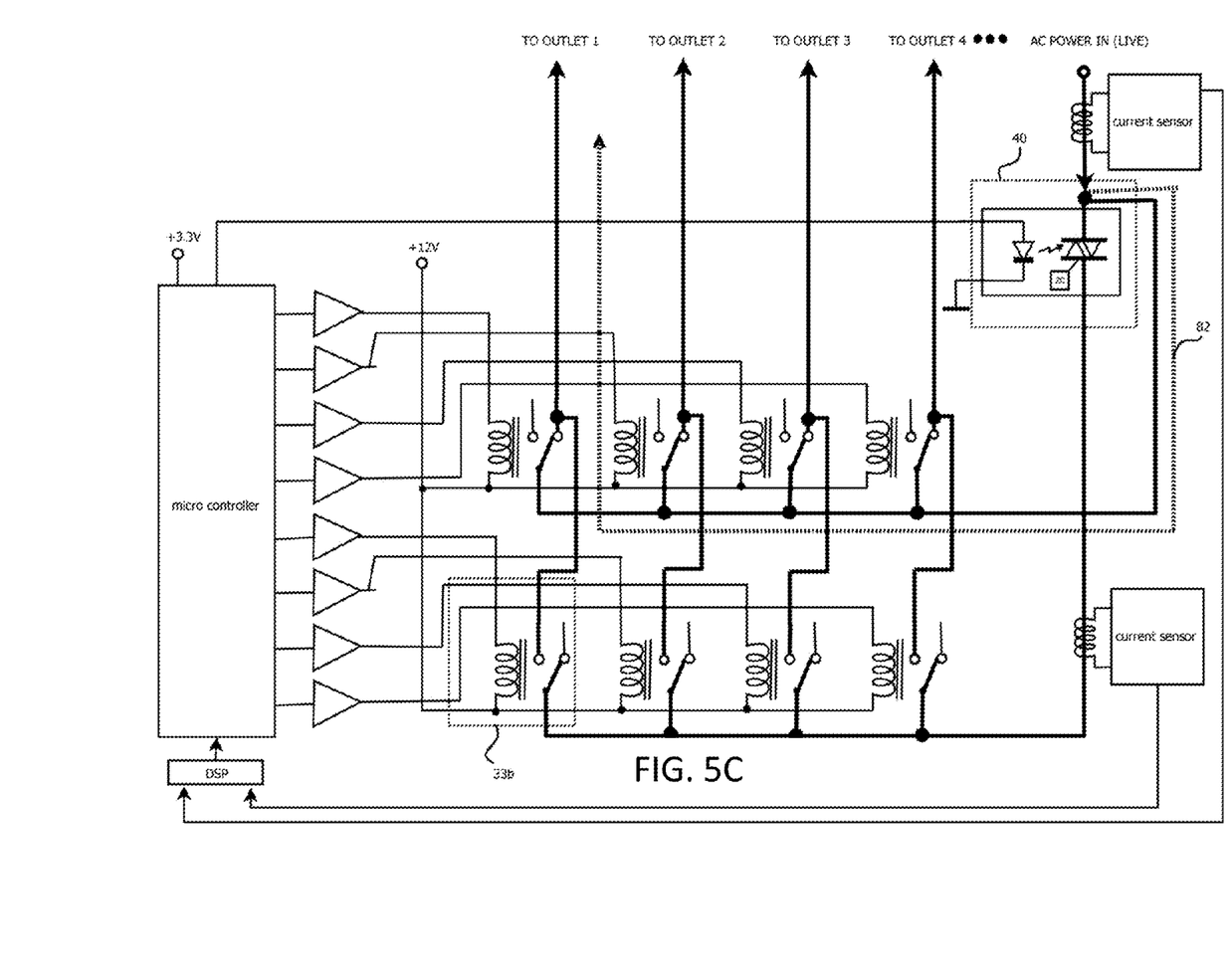
FIG. 5C illustrates a schematic diagram showing ON sequence-3.
Figure 6:
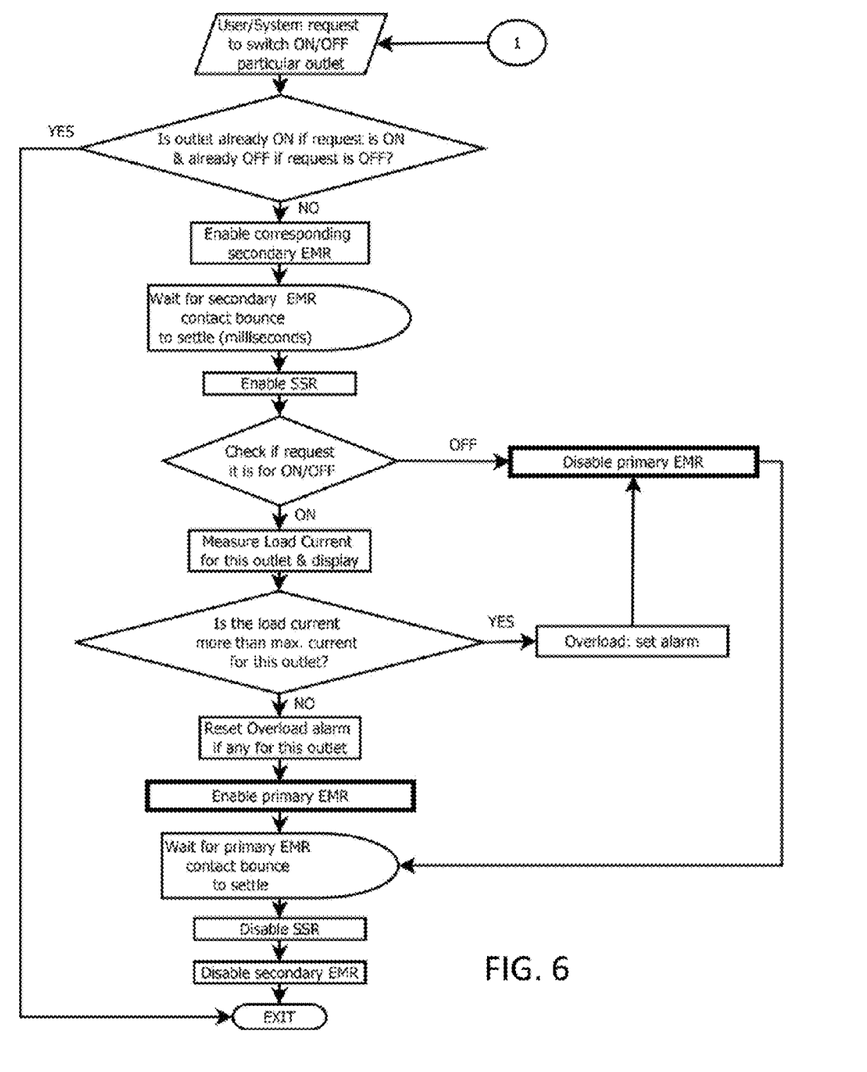
FIG. 6 illustrates a flow chart showing switching logic.

The switching operation may be better explained with the aid of FIGS. 4 and 5. FIGS. 4A, 4B and 4C correspond to switching OFF an outlet, and FIGS. 5A, 5B and 5C are related to switching ON the outlet. FIG. 6 shows the flow chart or switching operation. The following explanation focuses on one pair of EMRs 33a, 33b that corresponds to the first outlet for simplicity of explanations. The operations of other outlets may be identical. When the PDU system is started, all outlets will be in ON state. The current flows 71 from LIVE wire of AC input through EMR 33a as shown in FIG. 3. When there is an OFF request for outlet-1 from the user 90 (e.g., through web interface or SNMP) or system (e.g., through overload protection mechanism event), the firmware of micro-controller first enables secondary EMR 33b and waits until tile contact bounce of EMR 33b is over then enable SSR 40. Now the current path 72 is established as shown in FIG. 4A. The SSR 40 now operates in parallel with EMR 33a and in series with EMR 33b. Next, the controller switches OFF primary EMR 33a breaking the current path 71 as shown in FIG. 4B. Once the primary EMR 33a bounce settles down, the SSR 40 is switched OFF followed by secondary EMR 33b breaking current path 72 as shown in FIG. 4C. This completes the cycle of OFF sequence.

The switching ON sequence is reverse of the OFF sequence. When the user or system event request microcontroller to switch OFF an outlet, it first switches on the secondary EMR 33b and wait until the contact bounce is over. Then controller switches ON SSR 40 to establish the current path 81 as shown in FIG. 5A. Next the micro-controller measures load current using outlet current sensor 23b as shown in FIG. 6 flow chart for outlet-1 and checks for any overload status or conditions. If there isn't an overload, next it switches ON primary EMR 33a and waits for its contact to settle and establishes the current path 82 as shown in FIG. 5B. The SSR 40 now operates in parallel with EMR 33a and in series with EMR 33b. Next, it switches OFF primary EMR 33b breaking the current path 81 as shown in FIG. 5C. This completes the cycle of ON sequence.

Figure 7A:
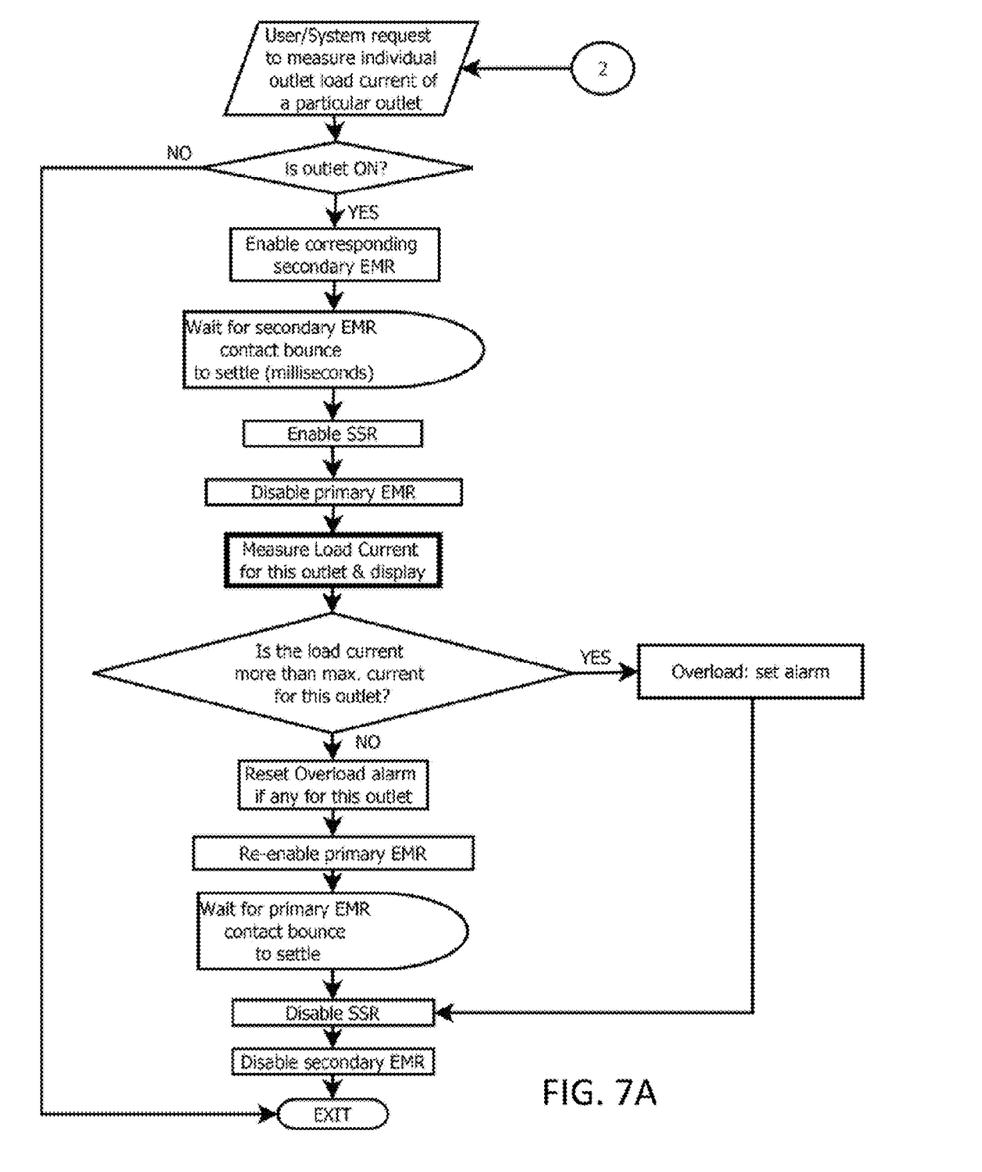
FIG. 7A illustrates a flow chart showing individual outlet current monitoring and measurement logic.
Figure 7B:
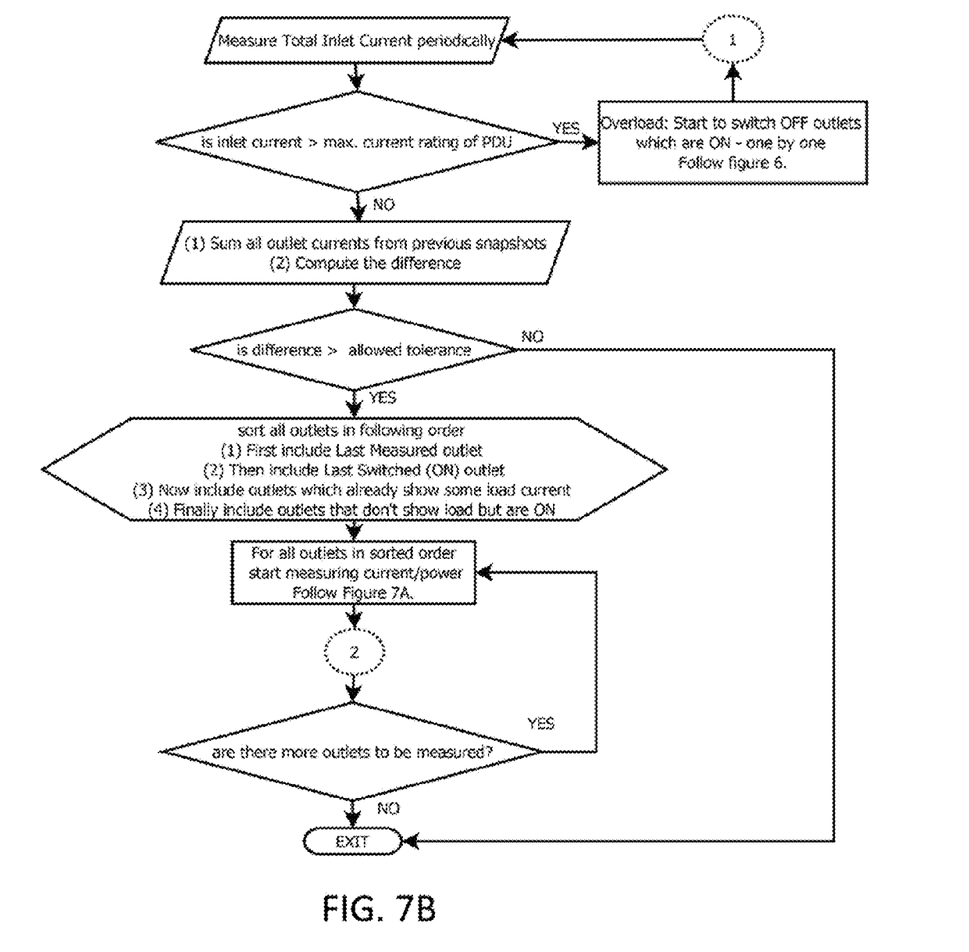
FIG. 7B illustrates a flow chart showing inlet and individual outlets periodic current monitoring and measurement logic.

As described above the controller module has two current sensors one for inlet 23a and one for outlet 23b. The outlet sensor 23b is the shared among all outlets by enabling particular secondary EMR in series with the SSR as described in the switching operation above. The inlet current may be monitored continuously, but the individual outlet monitoring is done at the lime of switching of particular outlet (FIG. 6) or by comparing periodically the inlet current sensor reading to sum of all individual outlet current sensors reading as shown in FIGS. 7B and 7A. This flow chart also shows how overload situation is detected at inlet—FIG. 7B and individual outlets—FIG. 7A. If the difference between the inlet sensor reading and Sum of all outlet sensor readings exceeds certain thresholds (which may be configurable) it triggers the monitoring of current at each individual outlet. As a result, the accuracy of the individual outlet monitoring depends at least in part on the tolerance threshold setting which includes basically a percentage of total current variation at any given time in some embodiments. Because the total current from inlet sensor is monitored continuously, the accuracy of inlet monitoring may be determined just by the accuracy of the sensor and associated sensing circuitry—which is higher than the individual outlet's accuracy.

Even though the above illustrates the application of the invention in AC (alternating current) switched power distribution systems in some embodiments, it may also be used in DC (direct current) switched power distribution systems as well with a shunt resister as current sensor instead of RMS current sensor in some other embodiments.

As to a further discussion of the manner of usage and operation of various embodiments of the invention, the same may be apparent from the above description. Accordingly, no further discuss ion relating to the manner of usage and operation will be provided.

With respect to the description, it is to be realized that the optimal dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by various embodiments of the invention.

Therefore, the foregoing is considered as illustrative only of the principles of the invention. Further, since numerous modifications and changes will readily occur to those skilled in (he an, it is not desired to limit the invention to the exact construct ion and operation shown and described, and accordingly, all suitable modifications and equivalents may be resorted 10, falling within the scope of the invention.

What is claimed is:

1. An apparatus for implementing switched power distribution unit, comprising:
   a plurality of power outlets;
   a first hybrid switching module that switches on or off the plurality of power outlets, the hybrid switching module comprising a solid-state relay and a pair of electro-mechanical relays for at least one power outlet of the plurality of power outlets, in which the solid-state relay is shared among the plurality of power outlets;
   a controller that communicates with the hybrid switching module via at least one or more digital lines to provide the switched power distribution; and
   a display for displaying information related to the at least one power outlet.

2. The apparatus of claim 1, further comprising:
   a first current detection circuitry that detects a total current on an inlet of the apparatus; and
   a second current detection circuitry that detects an individual load of the at least one power outlet, wherein the second detection circuitry is shared among the plurality of power outlets; and
   an overload protection and automatic recovery feature for the at least one power outlet using at least the first current detection circuitry and the second current detection circuitry.

3. The apparatus of claim 2, wherein the first current detection circuitry functions the total current continuously, and the second current detection circuitry functions based on a criterion.

4. The apparatus of claim 1, further comprising:
   a voltage detection circuitry for measuring electrical voltage.

5. The apparatus of claim 1, wherein the solid state relay comprises a zero-crossing semiconductor relay.

6. The apparatus of claim 1, wherein the solid state relay is optically isolated from a load of the apparatus.

7. The apparatus of claim 1, wherein the solid state relay is configured to switch at zero voltage.

8. The apparatus of claim 4, wherein the first current detection circuitry or the second current detection circuitry comprises a type of an inductive circuitry or a resistive circuitry.

9. The apparatus of claim 8, wherein the type of the voltage detection circuitry is determined by a criterion, in which the criterion includes at least one of power consumption measurement accuracy requirement and a maximum load into the apparatus.

10. The apparatus of claim 4, wherein the voltage detection circuitry comprises a simple alternating current voltage divider providing power to drive an analog input of the controller.

11. The apparatus of claim 1, wherein the controller comprises a web server running thereon.

12. The apparatus of claim 11, wherein the controller comprises at least one of a direct current converter, an Ethernet driver, an EEPROM, and a signal processor.

13. The apparatus of claim 12, wherein the web server interacts with a web interface stored in the EEPROM, wherein the web interface is used to respond to one or more requests for the apparatus from a user.

14. The apparatus of claim 1, wherein the apparatus comprises a second hybrid switching module, wherein the first hybrid switching module and the second hybrid switching module share the solid-state relay.

15. A method for implementing switched power distribution unit, comprising:
   identifying a plurality of power outlets on a switched power distribution system;
   using a controller that communicates with a hybrid switching module that switches on or off the plurality of power outlets,
   switching at least one power outlet of the plurality of power outlets to an ON state or an OFF state by using at least the hybrid switching module, wherein the hybrid switching module comprises a solid-state relay and a pair of electro-mechanical relays for at least one power outlet of the plurality of power outlet; and
   displaying information related to the at least one power outlet on a display component of the switched power distribution system.

16. The method of claim 15, further comprising:
   performing first power monitoring for an input of the apparatus by using a first current detection circuitry; and
   performing second power monitoring for the at least one power outlet by using a second current detection circuitry.

17. The method of claim 15, further comprising:
   performing electrical voltage monitoring by using a voltage detection circuitry.

18. The method of claim 17, further comprising:
   determining a type of the voltage detection circuitry based at least in part upon a criterion, the criterion comprising at least one of power consumption measurement accuracy requirement and a maximum load into the apparatus.

19. The method of claim 15, further comprising:
   identifying a web interface running on the controller in response to one or more requests on the power distribution system from a remote user, wherein the web interface comprises one or more web pages are stored on at least a memory of the switched power distribution system.

20. The method of claim 15, further comprising:
   providing outlet level overload protection by using the first current detection circuitry and the second current detection circuitry;

scaling up a total number of the plurality of power outlets in the switched power distribution system using a corresponding number of hybrid switching modules; and
preventing misfiring of EMRs by connecting an enable bit of two octal latches between driver and controller.

* * * * *